United States Patent
Im et al.

(10) Patent No.: US 7,447,089 B2
(45) Date of Patent: Nov. 4, 2008

(54) BITLINE PRECHARGE VOLTAGE GENERATOR

(75) Inventors: Jae-Hyuk Im, Kyoungki-do (KR); Kee-Teok Park, Kyoungki do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 277 days.

(21) Appl. No.: 11/517,351

(22) Filed: Sep. 8, 2006

(65) Prior Publication Data

US 2007/0053232 A1 Mar. 8, 2007

(30) Foreign Application Priority Data

Sep. 8, 2005 (KR) .................. 10-2005-0083691

(51) Int. Cl.
*G11C 7/00* (2006.01)

(52) U.S. Cl. ............. 365/203; 365/189.06; 365/189.07; 365/189.09; 365/191

(58) Field of Classification Search ................. 365/203, 365/189.06, 189.07, 189.09, 191
See application file for complete search history.

(56) References Cited

U.S. PATENT DOCUMENTS

| | | | |
|---|---|---|---|
| 5,963,494 | A | 10/1999 | Khang |
| 6,667,921 | B2 | 12/2003 | Park |
| 2004/0052146 | A1 | 3/2004 | Sim |
| 2005/0237833 | A1* | 10/2005 | Byeon et al. ................. 365/203 |
| 2007/0263465 | A1* | 11/2007 | Lee ............................. 365/203 |

FOREIGN PATENT DOCUMENTS

| | | |
|---|---|---|
| JP | 2003-37491 A | 2/2003 |
| KR | 1997-0063257 | 9/1997 |
| KR | 1998-0005006 | 3/1998 |
| KR | 2001-0056118 | 7/2001 |
| KR | 2002-0096461 | 12/2002 |
| KR | 2004-0025186 | 3/2004 |
| KR | 2006-0038583 | 5/2006 |

OTHER PUBLICATIONS

Korean Office Action issued in corresponding Korean Patent Application No. KR 10-2005-0083691, dated Oct. 30, 2006.
Korean Patent Gazette issued in Korean Patent Application No. KR 10-0706826 issued on Apr. 12, 2007.

* cited by examiner

*Primary Examiner*—Pho M. Luu
(74) *Attorney, Agent, or Firm*—McDermott Will & Emery LLP

(57) ABSTRACT

A bitline precharge voltage generator can generate multiple bitline precharge voltages when bitlines are precharged, thereby providing a stable operation regardless of a core voltage used as a high data voltage of a memory cell. In the bitline precharge voltage generator, a core voltage level detecting unit detects a core voltage level, activates a first enable signal when the core voltage level is lower than a specific voltage level, and activates a second enable signal when the core voltage level is higher than the specific voltage level. A bitline precharge voltage generating unit generates a bitline precharge voltage corresponding to half of the core voltage level when the first enable signal is activated. A bitline precharge voltage clamping unit generates a clamped bitline precharge voltage having a constant voltage level when the second enable signal is activated, regardless of the core voltage level.

20 Claims, 4 Drawing Sheets

BITLINE PRECHARGE VOLTAGE GENERATOR

FIELD OF THE INVENTION

The present invention relates to a semiconductor device; and, more particularly, to a bitline precharge voltage generator that can generate multiple bitline precharge voltages when bitlines are precharged, thereby providing a stable operation regardless of a core voltage used as a high data voltage of a memory cell.

DESCRIPTION OF RELATED ART

A semiconductor memory device includes a memory cell for storing data, a peripheral circuit for reading/writing data from/to the memory cell, and an internal voltage generator for generating an internal voltage used for operating the memory device.

FIG. 1 is a circuit diagram of a conventional dynamic random access memory (DRAM) cell.

The DRAM cell consists of one transistor N1 and one capacitor C1. The transistor N1 is switched to connect a bitline BL and the capacitor C1, so that 1-bit data is stored in the capacitor C1. A bitline sense amplifier (BLSA) 1 amplifies cell data applied through the bitline pair BL and BL/. Transistors N2 and N3 output the amplified cell data in response to a select signal Yi.

In such a conventional DRAM, a term "active time" means a time when a wordline WL is activated and thus the write/read operations can be performed. A term "precharge operation" means an operation for equalizing the levels of the bitlines BL and /BL when the wordline WL is deactivated.

A bitline precharge voltage (VBLP) represents a voltage applied to the bitlines BL and /BL during the precharge operation. Generally, the bitline precharge voltage (VBLP) is half of a core voltage (VCORE/2) so as to minimize the current consumption during the equalization operation.

FIG. 2 is a circuit diagram of a conventional bitline precharge voltage generator.

As shown, the conventional bitline precharge voltage generator includes PMOS transistors P1 to P3 and NMOS transistors N4 to N6.

The PMOS transistor P1 is connected between a core voltage (VCORE) terminal and a node ND1 and has a gate receiving a ground voltage VSS. The NMOS transistor N4 is connected between the node ND1 and the PMOS transistor P2 and has a gate connected to the node ND1. The PMOS transistor P2 is connected between the NMOS transistor N4 and a node ND2 and has a gate connected to the node ND2. The NMOS transistor N5 is connected between the node ND2 and a ground voltage (VSS) terminal and has a gate receiving a core voltage VCORE.

The NMOS transistor N6 is connected between a power supply voltage (VDD) terminal and a bitline precharge voltage (VBLP) terminal and has a gate connected to the node ND1. The PMOS transistor P3 is connected between the VBLP terminal and the VSS terminal and has a gate connected to the node ND2.

An operation of the conventional bitline precharge voltage generator will be described below.

The ground voltage VSS and the core voltage VCORE are applied to the gate of the PMOS transistor P1 and the gate of the NMOS transistor N5, respectively. Thus, a constant resistance ratio is formed at the nodes ND1 and ND2. The voltage level of the node ND1 is applied to the gate of the NMOS transistor N6, and the voltage level of the node ND2 is applied to the gate of the PMOS transistor P3. Therefore, the NMOS transistor N6 and the PMOS transistor P3 perform the pull-up operation and the pull-down operation, respectively.

The PMOS transistor P1 and the NMOS transistor N5 serve as a resistor, and the NMOS transistor N4 and the PMOS transistor P2 serve as a diode. The resistance ratio between the transistors P1 and N5 and the transistors N4 and P2 is adjusted such that the node ND3 has the level of VCORE/2.

The node ND1 has the level of VCORE/2+Vtn (where Vtn is an absolute value of a threshold voltage of the NMOS transistor N4), and the node ND2 has the level of VCORE/2+Vtp (where Vtp is an absolute value of a threshold voltage of the PMOS transistor P2). Therefore, the NMOS transistor N4 and the NMOS transistor N6 are adjusted to have the same threshold voltage (Vt), and the PMOS transistor P2 and the PMOS transistor P3 are adjusted to have the same threshold voltage (Vt).

If the bitline precharge voltage VBLP is lower than the level of VCORE/2, a gate-source voltage VGS of the NMOS transistor N6 becomes higher than Vtn. Thus, the bitline precharge voltage VBLP can be maintained at the level of VCORE/2 according to the pull-up operation of the NMOS transistor N6. On the other hand, if the bitline precharge voltage VBLP is higher than the level of VCORE/2, the PMOS transistor P3 is turned on, so that the level of the bitline precharge voltage VBLP is pulled down. Therefore, the bitline precharge voltage VBLP can be maintained at the level of VCORE/2.

In this manner, the bitline precharge voltage VBLP maintains the level of VCORE/2 in cooperation with the core voltage VCORE. When the core voltage VCORE changes in a normal condition, the bitline precharge voltage VBLP needs to be changed together therewith. However, there occurs a problem when the core voltage VCORE rises above a predetermined level, for example, VPP-Vt.

That is, the bitline precharge voltage generator can normally perform the write/read operations when the core voltage VCORE has a stable target level. However, when the core voltage VCORE rises above the level of VPP-Vt (where Vt represents a threshold voltage of the cell transistor N1), the core voltage VCORE is not completely written to the DRAM cell. Instead, only the maximum pumping voltage VPP-Vt is written to the DRAM cell.

At this point, the maximum voltage level that can be stored in the DRAM cell is VPP-Vt. This voltage is higher than the core voltage VCORE. Therefore, it is difficult to sufficiently transfer the level of VPP-Vt while the wordline WL is activated.

It is assumed that the level of VPP-Vt is transferred to the DRAM cell. After the write operation, the wordline WL is deactivated and the bitline precharge operation is carried out. At this point, because the bitline precharge voltage VBLP becomes the level of VCORE/2, the bitlines BL and /BL are precharged to the level of VCORE/2.

Thereafter, in reading the same DRAM cell, a charge sharing operation is performed to the DRAM cell in such a state that the level of the core voltage VCORE is not formed. Therefore, as the core voltage VCORE rises, the potential difference between high data stored in the memory cell and the level of VCORE/2 decreases, resulting in reliability degradation of the read operation.

In addition, the level of VPP-Vt is higher than the target core voltage VCORE. Therefore, if the level of VPP-Vt is insufficiently written to the memory cell, the potential difference between the high data of the memory cell and the precharge voltage VCORE/2 of the bitline BL decreases much more, thus increasing the probability that the read operation will fail.

SUMMARY OF THE INVENTION

It is, therefore, an object of the present invention to provide a bitline precharge voltage generator that can generate multiple bitline precharge voltages when bitlines are precharged, thereby providing a stable operation regardless of a core voltage used as a high data voltage of a memory cell.

In accordance with an aspect of the present invention, there is provided a bitline precharge voltage generator including: a core voltage level detecting unit for detecting a core voltage level, activating a first enable signal when the core voltage level is lower than a specific voltage level, and activating a second enable signal when the core voltage level is higher than the specific voltage level; a bitline precharge voltage generating unit for generating a bitline precharge voltage corresponding to half of the core voltage level when the first enable signal is activated; and a bitline precharge voltage clamping unit for generating a clamped bitline precharge voltage having a constant voltage level when the second enable signal is activated, regardless of the core voltage level.

In accordance with an aspect of the present invention, there is provided a semiconductor memory device, including a detecting unit for detecting a core voltage level to generate a detection result whether or not the core voltage level is lower than a predetermined voltage level, a generating unit for generating a precharge voltage according to the detection result, wherein, if the core voltage level is higher than the predetermined voltage level, the generating unit clamps down the core voltage level so that the clamped bitline precharge voltage has a constant voltage level regardless of the core voltage level.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device including a bitline precharge voltage generator in accordance with exemplary embodiments of the present invention will be described in detail with reference to the accompanying drawings.

Figure 1:
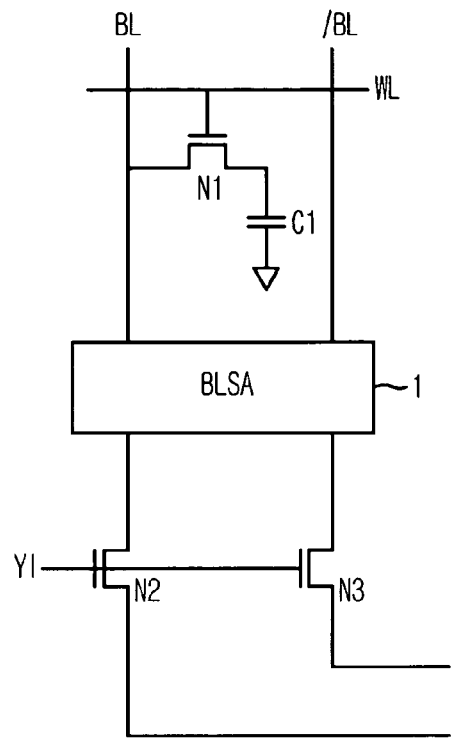
FIG. 1 is a circuit diagram of a conventional DRAM cell.
Figure 2:
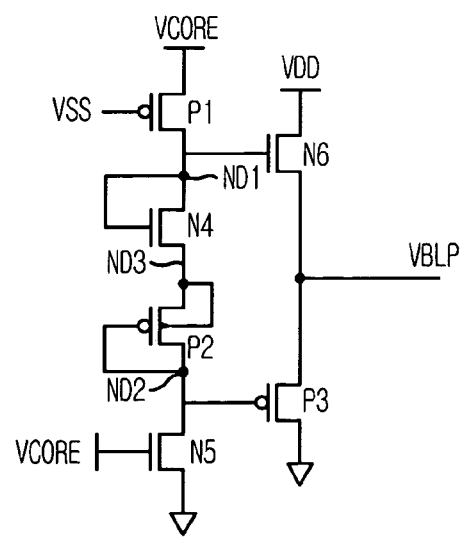
FIG. 2 is a circuit diagram of a conventional bitline precharge voltage generator.
Figure 3:
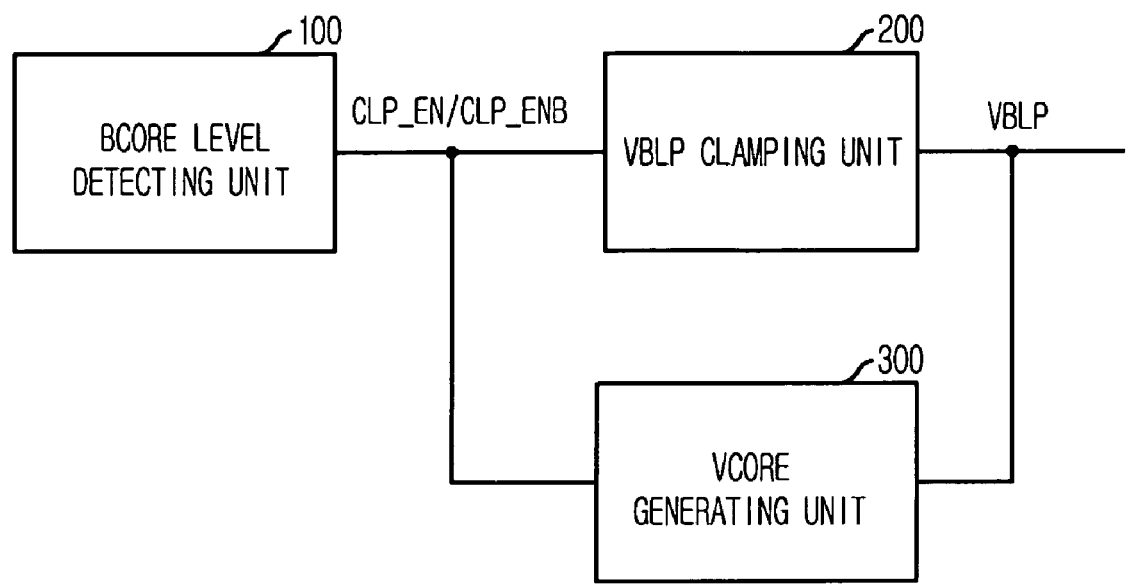
FIG. 3 is a block diagram of a bitline precharge voltage generator in accordance with an embodiment of the present invention.

FIG. 3 is a block diagram showing a bitline precharge voltage generator in accordance with an embodiment of the present invention.

Referring to FIG. 3, the bitline precharge voltage generator includes a VCORE level detecting unit 100, a VBLP clamping unit 200, and a VCORE generating unit 300.

The VCORE level detecting unit 100 detects the level of the core voltage VCORE to output enable signals CPL_EN and CLP_ENB. The VBLP clamping unit 200 generates a clamped bitline precharge voltage VBLP according to the enable signals CPL_EN and CPL_ENB. The VBLP generating unit 300 generates the bitline precharge voltage VBLP according to the enable signals CPL_EN and CPL_ENB.

When the core voltage VCORE is lower than a predetermined level, the VBLP generating unit 300 operates to generate the bitline precharge voltage VBLP. On the other hand, when the core voltage VCORE is higher than the predetermined level, the VBLP clamping unit 200 operates to generate the bitline precharge voltage VBLP.

Figure 4:
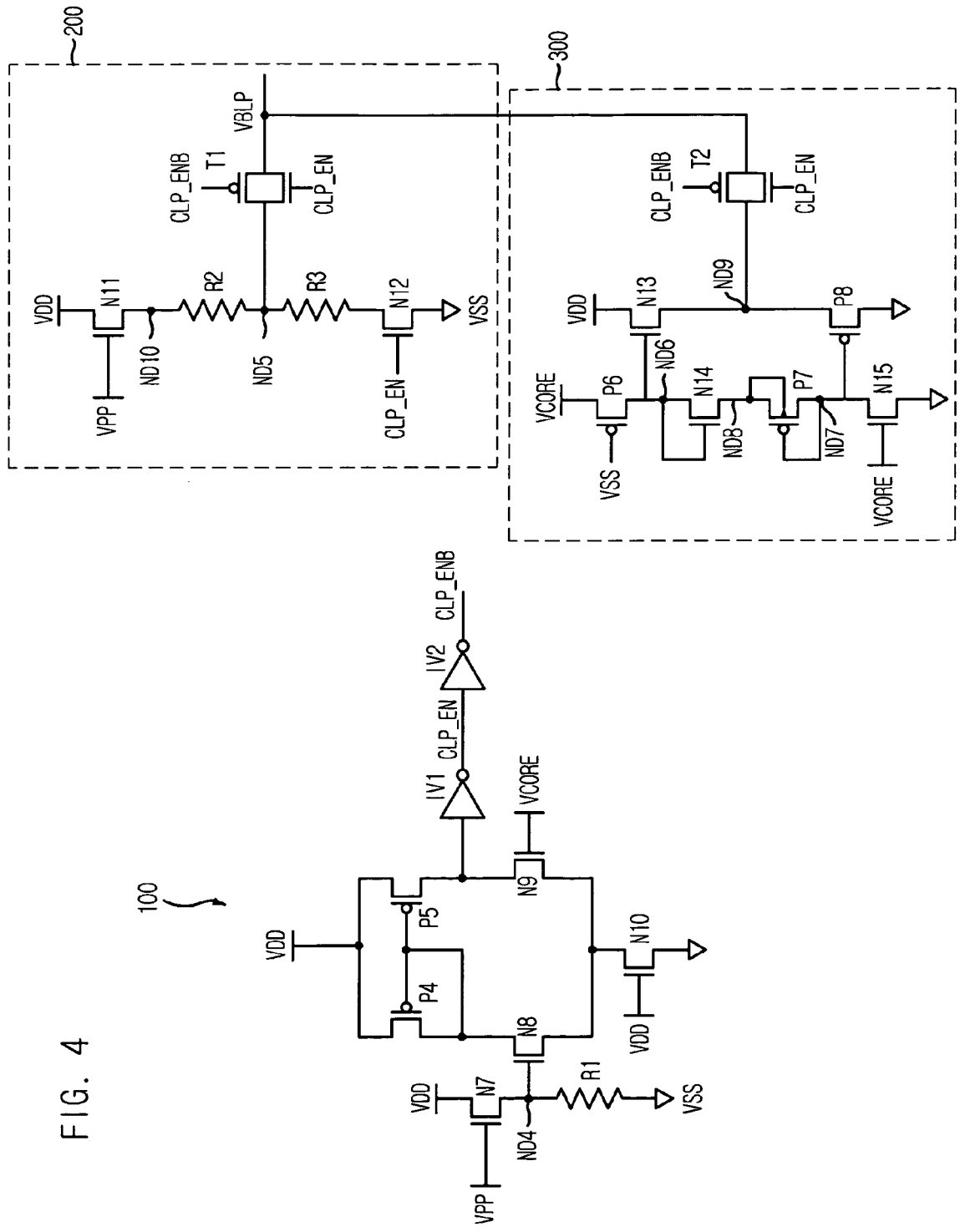
FIG. 4 is a detailed circuit diagram of the bitline precharge voltage generator illustrated in FIG. 3.

FIG. 4 is a detailed circuit diagram of the bitline precharge voltage generator in accordance with an embodiment of the present invention.

Referring to FIG. 4, the VCORE level detecting unit 100 includes a current mirror and a reference voltage generating unit. The current mirror is implemented with PMOS transistors P4 and P5 and NMOS transistors N8 to N10, and the reference voltage generating unit is implemented with an NMOS transistor N and a resistor R1.

The PMOS transistors P4 and P5 have gates commonly connected to a drain of the PMOS transistor P4, and sources commonly receiving the power supply voltage VDD. The NMOS transistor N8 is connected between the PMOS transistor P4 and the NMOS transistor N10 and has a gate connected to a node ND4. The NMOS transistor N9 is connected between the PMOS transistor P5 and the NMOS transistor N10 and has a gate receiving the core voltage VCORE. The NMOS transistor N10 is connected between the NMOS transistors N8 and N9 and a VSS terminal and has a gate receiving the power supply voltage VDD.

The NMOS transistor N7 is connected between the VDD terminal and the node ND4 and has a gate receiving the pumping voltage VPP. The NMOS transistor N7 receives a process feedback of the cell transistor and generates the reference voltage in cooperation with a threshold voltage of the cell transistor. The resistor R1 is connected between the node ND4 and the VSS terminal. Inverters IV1 and IV2 sequentially invert the output of the VCORE level detecting unit 100 to output the enable signals CPL_EN and CPL_ENB, respectively.

The VBLP clamping unit 200 includes NMOS transistors N11 and N12, resistors R2 and R3, and a transfer gate T1.

The NMOS transistor N11 is connected between the VDD terminal and the resistor R2 and has a gate receiving the pumping voltage VPP. The resistor R2 is connected between the NMOS transistor N11 and a node ND5, and the resistor R3 is connected between the node ND5 and the NMOS transistor N12. The NMOS transistor N12 is connected between the resistor R3 and the VSS terminal and has a gate receiving the enable signal CPL_EN. The transfer gate T1 includes a PMOS transistor receiving the enable signal CPL_ENB and an NMOS transistor receiving the enable signal CPL_EN. The transfer gate T1 outputs the voltage level of the node ND5 as the bitline precharge voltage VBLP.

The VBLP generating unit 300 includes PMOS transistors P6 to P8, NMOS transistors N13 to N15, and a transfer gate T2.

The PMOS transistor P6 is connected between the VCORE terminal and a node ND6 and has a gate receiving the ground voltage VSS. The NMOS transistor N14 is connected between the node ND6 and a node ND8 and has a gate connected between the node ND6. The PMOS transistor P7 is connected between the node ND8 and a node ND7 and has a gate connected to the node ND8. The NMOS transistor ND15 is connected between the node ND7 and the VSS terminal and has a gate receiving the core voltage VCORE.

The NMOS transistor N13 is connected between the VDD terminal and a node ND9 and has a gate connected to the node ND6. The PMOS transistor P8 is connected between the node ND9 and the VSS terminal and has a gate connected to the node ND7. The transfer gate T2 includes a PMOS transistor receiving the enable signal CPL_EN and an NMOS transistor receiving the enable signal CPL_ENB. The transfer gate T2 outputs the voltage level of the node ND9 as the bitline precharge voltage VBLP.

An operation of the bitline precharge voltage generator in accordance with the present invention will be described below in detail.

The VCORE level detecting unit 100 compares the voltage level of the node ND4 with the core voltage VCORE and outputs the enable signals CPL_EN and CPL_ENB having opposite phases to each other. To this end, the pumping voltage VPP is applied to the gates of the NMOS transistors N7 and N11. Thus, the power supply voltage VDD is supplied, so that the NMOS transistors N7 and N11 have the same threshold voltage as that of the cell transistor. Accordingly, source voltages of the NMOS transistors N7 and N11 are set to VPP-Vt (where Vt is threshold voltages of the cell transistors N7 and N11).

When the node ND4 has the level of VPP (wordline boost voltage)-Vt and the core voltage VCORE is higher than the level of VPP-Vt, the enable signals CPL_EN and CPL_ENB become high and low, respectively. On the other hand, when the core voltage VCORE is lower than the level of VPP-Vt, the enable signals CPL_EN and CPL_ENB become low and high, respectively.

When the core voltage VCORE is lower than the level of VPP-Vt, the VBLP generating unit 300 is activated. Accordingly, the enable signals CPL_EN and CPL_ENB are applied to the transfer gate T2. When the enable signals CPL_EN and CPL_ENB are low and high, respectively, the transfer gate T2 outputs the bitline precharge voltage VBLP. On the other hand, when the enable signals CLP_EN and CLP_ENB are high and low, respectively, the transfer gate T2 is turned on so that the bitline precharge voltage VBLP is not output.

When the core voltage VCORE is higher than the level of VPP-Vt, the VBLP clamping unit 200 is activated to generate the bitline precharge voltage VBLP with a constant level, regardless of the level of the core voltage VCORE.

Accordingly, the enable signals CPL_EN and CPL_ENB are applied to the transfer gate T1. When the enable signals CPL_EN and CPL_ENB are high and low, respectively, the transfer gate T1 outputs the bitline precharge voltage VBLP. On the other hand, when the enable signals CPL_EN and CPL_ENB are low and high, respectively, the transfer gate T1 is turned off so that the bitline precharge voltage VBLP is not output.

At this point, the node ND10 has the level of VPP-Vt, and the resistance ratio of the resistors R1 and R2 is adjusted such that the voltage level of the node ND5 becomes half the voltage level of the node ND10. Therefore, even though the core voltage VCORE rises above a predetermined level, the output of the VBLP clamping unit 200 can be fixed to the level of (VPP-Vt)/2.

When the core voltage VCORE to be written to the DRAM cell as high data rises excessively, the core voltage VCORE required for the write operation may not be all transferred to the memory cell. That is, a write time may be insufficient, or the core voltage VCORE may be higher than the level of VPP-Vt. In this case, if the data is again read, the degree of the charge sharing is reduced, thus degrading the operation reliability of the DRAM. Therefore, the present invention can operate the DRAM stably by generating the level of the bitline precharge voltage VBLP corresponding to half the high data written to the memory cell.

The above description is directed to the operation for fixing the bitline precharge voltage to the level of (VPP-Vt)/2 when the core voltage VCORE rises above VPP-Vt.

Figure 5:
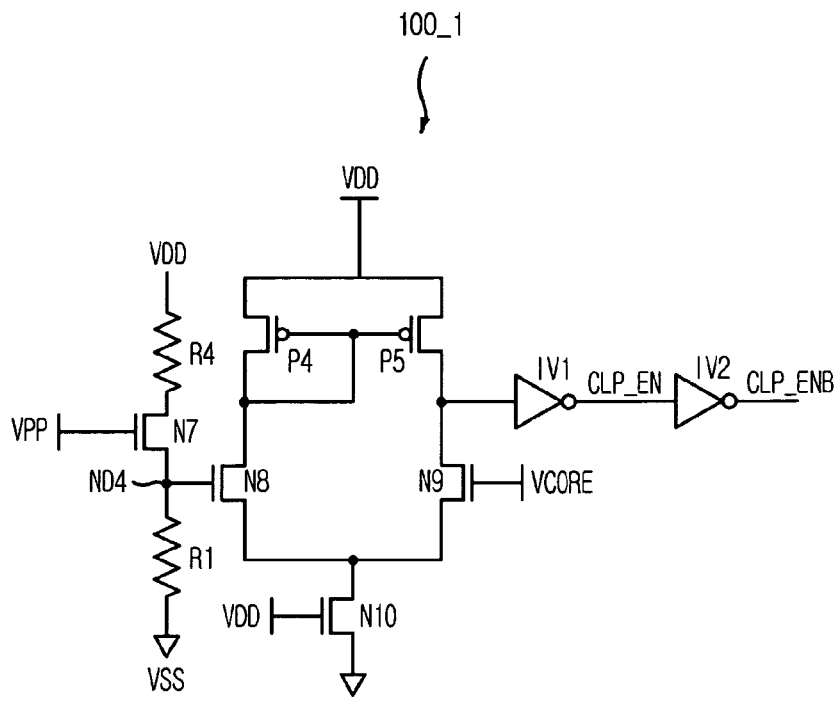
FIG. 5 is a circuit diagram of a VCORE level detecting unit of FIG. 3 in accordance with an embodiment of the present invention.

FIG. 5 is a circuit diagram of a VCORE level detecting unit 100_1 in accordance with an embodiment of the present invention.

Compared with the VCORE level detecting unit 100 of FIG. 4, the VCORE level detecting unit 100_1 of FIG. 5 further includes a resistor R4.

When the core voltage VCORE rises above a specific voltage Vxx, the bitline precharge voltage VBLP can be fixed to the level of Vxx/2 by changing a comparison voltage of the VCORE level detecting unit 100. At this point, the NMOS transistor N7 need not receive the process feedback of the threshold voltage of the cell transistor. In addition, the NMOS transistor N7 has only to generate the specific voltage Vxx.

That is, the voltage level of the node ND4, which will be compared with the core voltage VCORE, is set to the specific voltage Vxx by adjusting the resistance ratio of the resistors R4 and R1. The VBLP clamping unit 200 has only to transfer Vxx/2 as the bitline precharge voltage VBLP.

Figure 6:
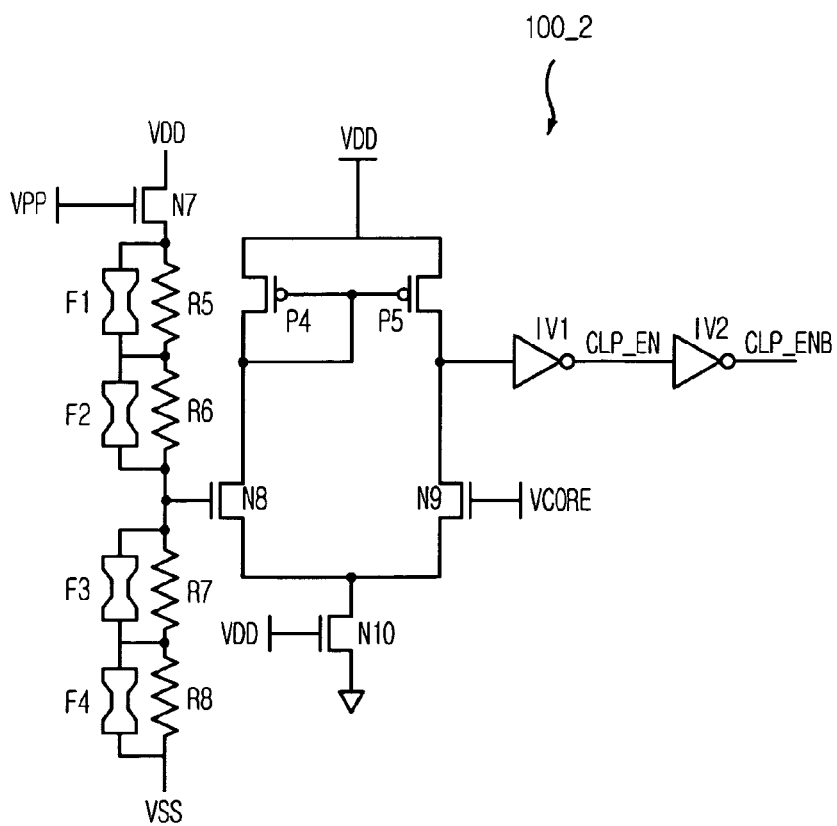
FIG. 6 is a circuit diagram of a VCORE level detecting unit of FIG. 3 in accordance with another embodiment of the present invention.

FIG. 6 is a circuit diagram of a VCORE level detecting unit 100_2 in accordance with another embodiment of the present invention.

Compared with the VCORE level detecting unit 100 of FIG. 4, the VCORE level detecting unit of FIG. 6 further includes resistors R5 to R8 and fuses F1 to F4.

Referring to FIG. 6, the VCORE level detecting unit 100_2 trims the level of the specific voltage Vxx by adjusting the resistance ratio of the resistors R5 to R8 using the fuses F1 to F4, metal options, or logics.

As described above, when the bitlines of the semiconductor memory device are precharged, multiple bitline precharge voltages are generated, thereby providing a stable operation regardless of a core voltage used as a high data voltage of a memory cell.

The present application contains subject matter related to Korean patent application No. 10-2005-0083691, filed in the Korean Intellectual Property Office on Sep. 8, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A bitline precharge voltage generator, comprising:
   a core voltage level detecting unit for detecting a core voltage level, activating a first enable signal when the core voltage level is lower than a specific voltage level, and activating a second enable signal when the core voltage level is higher than the specific voltage level;
   a bitline precharge voltage generating unit for generating a bitline precharge voltage corresponding to half of the core voltage level when the first enable signal is activated; and
   a bitline precharge voltage clamping unit for generating a clamped bitline precharge voltage having a constant voltage level when the second enable signal is activated, regardless of the core voltage level.

2. The bitline precharge voltage generator of claim 1, wherein the core voltage level detecting unit compares the core voltage level and the specific voltage level, the specific voltage level having the level of VPP-Vt, where VPP represents a pumping voltage and Vt represents a threshold voltage of a cell transistor.

3. The bitline precharge voltage generator of claim 1, wherein the core voltage level detecting unit includes:
   a reference voltage generating unit for generating the specific voltage level;
   a current mirror for comparing the specific voltage level with the core voltage; and
   an inverting unit for inverting an output of the current mirror to output the first and second enable signals having opposite phases to each other.

4. The bitline precharge voltage generator of claim 3, wherein the reference voltage generating unit includes:
   a first MOS transistor connected between a power supply voltage terminal and an output terminal of the specific voltage level, the first MOS transistor having a gate receiving a wordline boost voltage, the first MOS transistor having a threshold voltage identical to that of a cell transistor; and
   a first resistor connected to the output terminal of the specific voltage level and a ground voltage.

5. The bitline precharge voltage generator of claim 3, wherein the reference voltage generating unit includes:
   a second MOS transistor connected to a power supply voltage terminal and has a gate receiving a wordline boost voltage;
   a second resistor connected between the second MOS transistor and the output terminal of the specific voltage level; and
   a third resistor connected between the output terminal of the specific voltage level and a ground voltage.

6. The bitline precharge voltage generator of claim 3, wherein the reference voltage generating unit includes:
   a third MOS transistor connected to a power supply voltage terminal and having a gate receiving a wordline boost voltage;
   a plurality of resistors connected in series between the third MOS transistor and a ground voltage terminal; and
   a plurality of fuses connected in parallel to the plurality of resistors, respectively.

7. The bitline precharge voltage generator of claim 1, wherein the bitline precharge voltage generating unit includes:
   a first resistor division unit for dividing the core voltage and a ground voltage in a predetermined resistance ratio;
   a driving unit for performing pull-up/pull-down operations according to an output of the first resistor division unit to generate the bitline precharge voltage; and
   a first transfer gate configured to be turned on in response to the activation of the first enable signal to output the bitline precharge voltage.

8. The bitline precharge voltage generator of claim 1, wherein the bitline precharge voltage clamping unit divides the level of VPP-Vt in a predetermined resistance ratio when the second enable signal is activated, and generates the clamped bitline precharge voltage.

9. The bitline precharge voltage generator of claim 1, wherein the bitline precharge voltage clamping unit includes:
   a fourth MOS transistor connected to a power supply voltage terminal and having a gate receiving a wordline boost voltage;
   a second resistor division unit for dividing an output voltage of the fourth MOS transistor in a predetermined resistance ratio;
   a fifth MOS transistor connected between the second resistor division unit and a ground voltage terminal and having a gate receiving the second enable signal; and
   a second transfer gate for outputting an output of the second resistor division unit as the clamped bitline precharge voltage in response to the second enable signal.

10. A semiconductor memory device, comprising:
    a detecting unit for detecting a core voltage level to generate a detection result whether or not the core voltage level is lower than a predetermined voltage level;
    a generating unit for generating a precharge voltage according to the detection result, wherein, if the core voltage level is higher than the predetermined voltage level, the generating unit clamps down the core voltage level so that the clamped bitline precharge voltage has a constant voltage level regardless of the core voltage level.

11. The semiconductor memory device as recited in claim 10, wherein the detecting unit activates a first enable signal when the core voltage level is lower than a predetermined voltage level and a second enable signal when the core voltage level is higher than the predetermined voltage level.

12. The semiconductor memory device as recited in claim 11, wherein the generating unit includes:
    a bitline precharge voltage generating unit for generating a bitline precharge voltage corresponding to half of the core voltage level in response to the first enable signal; and
    a bitline precharge voltage clamping unit for generating a clamped bitline precharge voltage in response to the second enable signal, wherein the clamped bitline precharge voltage has a constant voltage level regardless of the core voltage level.

13. The semiconductor memory device of claim 12, wherein the bitline precharge voltage generating unit includes:
    a first resistor division unit for dividing the core voltage and a ground voltage in a predetermined resistance ratio;
    a driving unit for performing pull-up/pull-down operations according to an output of the first resistor division unit to generate the bitline precharge voltage; and
    a first transfer gate configured to be turned on in response to the activation of the first enable signal to output the bitline precharge voltage.

14. The semiconductor memory device of claim 12, wherein the bitline precharge voltage clamping unit divides the level of VPP-Vt in a predetermined resistance ratio when the second enable signal is activated, and generates the clamped bitline precharge voltage.

15. The semiconductor memory device of claim 12, wherein the bitline precharge voltage clamping unit includes:
    a fourth MOS transistor connected to a power supply voltage terminal and having a gate receiving a wordline boost voltage;
    a second resistor division unit for dividing an output voltage of the fourth MOS transistor in a predetermined resistance ratio;
    a fifth MOS transistor connected between the second resistor division unit and a ground voltage terminal and having a gate receiving the second enable signal; and
    a second transfer gate for outputting an output of the second resistor division unit as the clamped bitline precharge voltage in response to the second enable signal.

16. The semiconductor memory device of claim 10, wherein the core voltage level detecting unit compares the core voltage level and the specific voltage level, the specific voltage level having the level of VPP-Vt, where VPP represents a pumping voltage and Vt represents a threshold voltage of a cell transistor.

17. The semiconductor memory device of claim 10, wherein the core voltage level detecting unit includes:
a reference voltage generating unit for generating the specific voltage level;
a current mirror for comparing the specific voltage level with the core voltage; and
an inverting unit for inverting an output of the current mirror to output the first and second enable signals having opposite phases to each other.

18. The semiconductor memory device of claim 17, wherein the reference voltage generating unit includes:
a first MOS transistor connected between a power supply voltage terminal and an output terminal of the specific voltage level, the first MOS transistor having a gate receiving a wordline boost voltage, the first MOS transistor having a threshold voltage identical to that of a cell transistor; and
a first resistor connected to the output terminal of the specific voltage level and a ground voltage.

19. The semiconductor memory device of claim 17, wherein the reference voltage generating unit includes:
a second MOS transistor connected to a power supply voltage terminal and has a gate receiving a wordline boost voltage;
a second resistor connected between the second MOS transistor and the output terminal of the specific voltage level; and
a third resistor connected between the output terminal of the specific voltage level and a ground voltage.

20. The semiconductor memory device of claim 17, wherein the reference voltage generating unit includes:
a third MOS transistor connected to a power supply voltage terminal and having a gate receiving a wordline boost voltage;
a plurality of resistors connected in series between the third MOS transistor and a ground voltage terminal; and
a plurality of fuses connected in parallel to the plurality of resistors, respectively.

\* \* \* \* \*